(12) United States Patent
Pan et al.

(10) Patent No.: US 10,340,339 B2
(45) Date of Patent: Jul. 2, 2019

(54) SEMICONDUCTOR DEVICE AND METHOD OF FABRICATING THE SAME

(71) Applicant: Nuvoton Technology Corporation, Hsinchu (TW)

(72) Inventors: Chin-Han Pan, Hsinchu (TW); Yao-Feng Huang, Hsinchu (TW)

(73) Assignee: Nuvoton Technology Corporation, Hsinchu (TW)

( * ) Notice: Subject to any disclaimer, the term of this patent is extended or adjusted under 35 U.S.C. 154(b) by 507 days.

(21) Appl. No.: 14/596,237

(22) Filed: Jan. 14, 2015

(65) Prior Publication Data
US 2015/0333178 A1 Nov. 19, 2015

(30) Foreign Application Priority Data
May 16, 2014 (TW) .............................. 103117366 A

(51) Int. Cl.
| | |
|---|---|
| *H01L 29/78* | (2006.01) |
| *H01L 29/66* | (2006.01) |
| *H01L 29/06* | (2006.01) |
| *H01L 29/423* | (2006.01) |
| *H01L 21/28* | (2006.01) |
| *H01L 29/08* | (2006.01) |

(52) U.S. Cl.
CPC .... *H01L 29/0653* (2013.01); *H01L 29/42368* (2013.01); *H01L 29/66681* (2013.01); *H01L 29/7816* (2013.01); *H01L 21/28061* (2013.01); *H01L 29/0878* (2013.01)

(58) Field of Classification Search
CPC ...................... H01L 29/7816; H01L 29/66681

USPC ........................................... 257/339; 438/286
See application file for complete search history.

(56) References Cited

U.S. PATENT DOCUMENTS

| | | | |
|---|---|---|---|
| 4,288,801 | A | 9/1981 | Ronen |
| 6,087,232 | A | 7/2000 | Kim et al. |
| 8,264,040 | B2 | 9/2012 | Pfirsch |

(Continued)

FOREIGN PATENT DOCUMENTS

| | | |
|---|---|---|
| CN | 103178104 | 6/2013 |
| CN | 103354207 | 10/2013 |
| TW | 201103147 | 1/2011 |

OTHER PUBLICATIONS

M. Jagadesh Kumar, et al., "Extended-p+ Stepped Gate (ESG) LDMOS for Improved Performance," IEEE Transactions on Electron Devices, vol. 57, Issue 7, May 2010, pp. 1-19.

(Continued)

*Primary Examiner* — Walter H Swanson
(74) *Attorney, Agent, or Firm* — JCIPRNET

(57) ABSTRACT

A method of fabricating a semiconductor device is provided. A substrate is provided. The substrate includes a first region, a second region and a third region. An isolation structure is formed on the substrate in the first and the second region. A removing process is performed to remove the isolation structure in the first region, so as to form a first opening exposing a top surface of the substrate. A gate structure is formed on the substrate, covering a part of the substrate in the first region and a part of the isolation structure in the second region. A first doped region of a first conductive type is formed at one side of the gate structure in the first region, and a second doped region of the first conductive type is formed in the substrate in the third region.

10 Claims, 19 Drawing Sheets

(56) References Cited

U.S. PATENT DOCUMENTS

| | | | |
|---|---|---|---|
| 2007/0181943 A1* | 8/2007 | Pfirsch | H01L 29/7825 257/343 |
| 2008/0293206 A1* | 11/2008 | Hu | H01L 21/26513 438/297 |
| 2008/0308862 A1* | 12/2008 | Theeuwen | H01L 29/402 257/328 |
| 2014/0070315 A1* | 3/2014 | Levy | H01L 29/0634 257/343 |

OTHER PUBLICATIONS

Philip L Hower, et al., "Short and Long-Term Safe Operating Area Considerations in LDMOS Transistors," Reliability Physics Symposium, 2005. Proceedings. 43rd Annual. 2005 IEEE International, Apr. 17-21, 2005, pp. 545-550.
"Office Action of China Counterpart Application," dated Aug. 2, 2017, p. 1-p. 7, in which the listed references were cited.
"Office Action of Taiwan Counterpart Application", dated May 18, 2016, p. 1-p. 18, in which the listed references were cited.

* cited by examiner

US 10,340,339 B2

SEMICONDUCTOR DEVICE AND METHOD OF FABRICATING THE SAME

CROSS-REFERENCE TO RELATED APPLICATION

This application claims the priority benefit of Taiwan application serial no. 103117366, filed on May 16, 2014. The entirety of the above-mentioned patent application is hereby incorporated by reference herein and made a part of this specification.

BACKGROUND OF THE INVENTION

1. Field of the Invention

The embodiments of the invention relate to a semiconductor device and a fabricating method thereof, and particularly relates to a laterally diffused metal oxide semiconductor (LDMOS) device and a fabricating method thereof.

2. Description of Related Art

A laterally diffused metal oxide semiconductor (LDMOS) device is a typical high voltage device and the process of fabricating the same may be integrated with the process of fabricating a complementary metal oxide semiconductor (CMOS) to fabricate control circuits, logic circuits and power switches on a single chip. When operating a LDMOS device, a high breakdown voltage and a low on-state resistance (Ron) must be provided. The LDMOS device having a high breakdown voltage and a low on-state resistance (Ron) has a lower power consumption when being operated under a high voltage condition. Furthermore, a lower on-state resistance (Ron) allows the transistor have a higher drain current in saturation state to improve the operating speed of the device. However, the on-state resistance of the conventional LDMOS transistors cannot be further reduced to present a more preferable device characteristic. Therefore, it is necessary to develop a LDMOS transistor having a high breakdown voltage and/or low on-state resistance, so as to improve the device characteristic of the LDMOS transistor.

SUMMARY OF THE INVENTION

The embodiments of the invention provide a semiconductor device having a high breakdown voltage and/or low on-state resistance and a method of fabricating the same.

The embodiments of the invention provide a method of fabricating a semiconductor device. A substrate is provided. The substrate includes a first region, a second region, and a third region. In addition, the second region is located between the first region and the third region. An isolation structure is formed on the substrate in the first region and the second region. The isolation structure in the first region is removed by performing a removing process, so as to form a first opening exposing a top surface of the substrate. A gate structure is formed on the substrate. The gate structure covers a part of the substrate in the first region and a part of the isolation structure in the second region. A first doped region of a first conductive type is formed in the substrate in the first region at one side of the gate structure, and a second doped region of the first conductive type is formed in the substrate in the third region.

The embodiments of the invention provide a semiconductor device, including a substrate, an isolation structure, a gate structure, a first doped region, and a second doped region. The substrate includes the first region, the second region, and the third region. In addition, the second region is located between the first region and the third region. The isolation structure is located in the second region of the substrate, and at least a part of a bottom surface of the isolation structure and a top surface of the substrate are substantially coplanar. The isolation structure continuously extends from one end of the second region to another end of the second region. The gate structure covers a part of the substrate in the first region and a part of the isolation structure in the second region. A first doped region is of a first conductive type, located in the substrate in the first region, and adjacent to one side of the gate structure. A second doped region is of the first conductive type, located in the substrate in the third region, and adjacent to one side of the isolation structure.

The embodiments of the invention provide a semiconductor device, including a substrate, an isolation structure, a gate structure, a first doped region, and a second doped region. The substrate includes the first region, the second region, and the third region. In addition, the second region is located between the first region and the third region. The isolation structure is located on the substrate in the second region, and at least a part of a bottom surface of the isolation structure and a top surface of the substrate are substantially coplanar. The isolation structure continuously extends from one end of the second region to another end of the second region. A method of forming the isolation structure includes forming a field oxide layer by using local oxidation of silicon, and then removing a part of the field oxide layer by performing a patterning process. The gate structure covers a part of the substrate in the first region and a part of the isolation structure in the second region. A first doped region is of a first conductive type, located in the substrate in the first region, and adjacent to one side of the gate structure. A second doped region is of the first conductive type, located in the substrate in the third region, and adjacent to one side of the isolation structure.

In order to make the aforementioned features and advantages of the invention more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
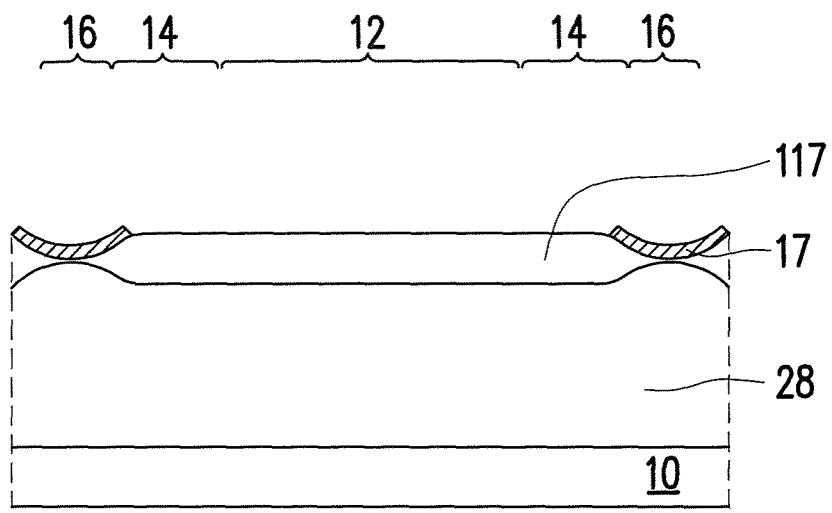
FIGS. 1A to 1H are cross-sectional views illustrating a method of fabricating a semiconductor device according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1A to 1H are cross-sectional views illustrating a method of fabricating a semiconductor device according to an embodiment of the invention.

The following description is made by taking a first conductive type as N-type and taking a second conductive type as P-type. However, the invention is not limited thereto. People having ordinary skills in the art shall appreciate that the first conductive type may be changed into P-type, while the second conductive type may be changed into N-type. In addition, an N-type dopant is phosphorous or arsenic, for example, and a P-type dopant is boron, for example.

First of all, referring to FIG. 1A, a substrate 10 having dopants of the second conductive type is provided. The substrate 10 includes a first region 12, a second region 14, and a third region 16. In addition, the second region 14 is located between the first region 12 and the third region 16. The substrate 10 may be formed of at least one semiconductor material selected from a group consisting of Si, Ge, SiGe, GaP, GaAs, SiC, SiGeC, InAs, and InP. In addition, the substrate 10 may be a silicon-on-insulator (SOI) substrate. Then, a pad oxide layer (not shown) is formed on the substrate 10. A material of the pad oxide layer is silicon oxide, for example, or other suitable materials. A method of forming the pad oxide layer is thermal oxidation, for example. Then, an ion implantation process is performed to the substrate 10 to form a doped region 28 of the first conductive type. Subsequently, an isolation structure 117 is formed on the substrate 10. The isolation structure 117 is at least located on the first region 12 and the second region 14. A material of the isolation structure 117 is silicon oxide, for example. A thickness of the isolation structure 117 is from approximately 3000 angstrom (Å) to approximately 6000 Å. In this embodiment, a method of forming the isolation structure 117 is local oxidation of silicon (LOCOS), for example. More specifically, a patterned mask 17 is formed on the pad oxide layer of the third region 16. A material of the patterned mask layer 17 is silicon nitride or other suitable materials, for example, and a method of forming the patterned mask layer 17 is chemical vapor deposition, for example. Then, a wet oxidation process, for example, is performed by using the patterned mask layer 17 as a mask, so as to grow a field oxide layer. A method of forming the isolation structure 117 is not limited to LOCOS as described in this embodiment, methods such as shallow trench isolation or chemical vapor deposition with a patterning process (e.g., photolithography and etching processes), etc., may be used as well. In other embodiments, the substrate 10 may further include an epitaxial layer of the first conductive type (not shown). Afterwards, as described above, the pad oxide layer is formed on the epitaxial layer, and then an ion implantation process is performed to form the doped region 28 of the first conductive type in the epitaxial layer. Then, the isolation structure 117 is formed on the epitaxial layer.

Figure 1B:
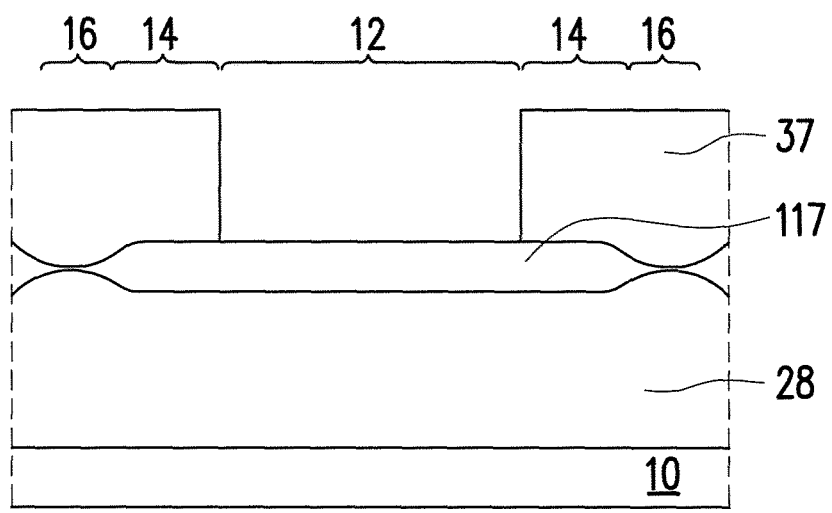
Figure 1C:
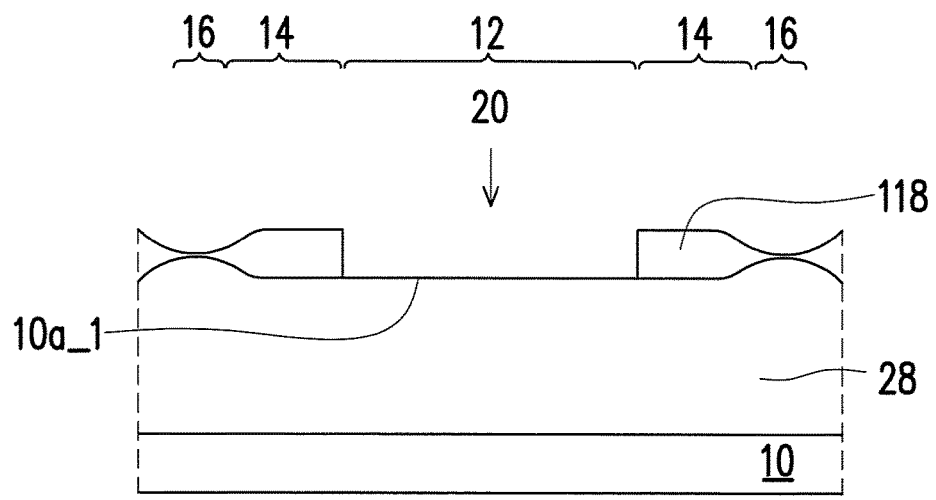

Subsequently, referring to FIGS. 1B and 1C, the patterned mask layer 17 is removed by using wet etching, for example. Then, a removing process is performed to remove the isolation structure 117 on the first region 12, so as to form an isolation structure 118. The isolation structure 118 has a first opening 20 that exposes a top surface 10a_1 of the substrate 10 in the first region 12. A method of removing the isolation structure 117 may be a photolithography and an etching, for example. More specifically, referring to FIG. 1B, a patterned photoresist layer 37 is formed on the isolation structure 117. Then, the isolation structure 117 is etched by using the patterned photoresist layer 37 as a mask, so as to form the isolation structure 118 having the first opening 20, as shown in FIG. 1C. A method of etching the isolation structure 117 is dry etching, for example. Then, the patterned photoresist layer 37 is removed.

Subsequently, referring to FIG. 1D, a gate dielectric layer 124 is formed on the top surface 10a_1 of the substrate 10 in the first region 12. A material of the gate dielectric layer 124 is silicon oxide, silicon nitride, or a high dielectric constant material having a dielectric constant greater than 4, for example. A method of forming the gate dielectric layer 124 is thermal oxidation, for example. Of course, any other suitable methods may be used. Then, a gate conductive layer 125 is formed on the gate dielectric layer 124. The gate conductive layer 125 may be formed of a single material, such as a doped polysilicon layer, for example. The gate conductive layer 125 may also be formed of two or more materials, such as a doped polysilicon layer 126 and a metal silicide layer 136. A method of forming the doped polysilicon layer 126 is chemical vapor deposition, for example. The metal silicide layer 136 includes a metal silicide with a refractory metal, such as a silicide of one of nickel, cobalt, titanium, copper, molybdenum, tantalum, tungsten, erbium, zirconium, platinum and an alloy thereof, for example. A method of forming the metal silicide layer 136 is physical vapor deposition, for example, such as evaporation or sputtering. Then, a photoresist layer is formed on the substrate, and then a photolithography process is performed to form a patterned photoresist layer 38. The gate conductive layer 125 on the first region 12 is exposed by the patterned photoresist layer 38.

Figure 1D:
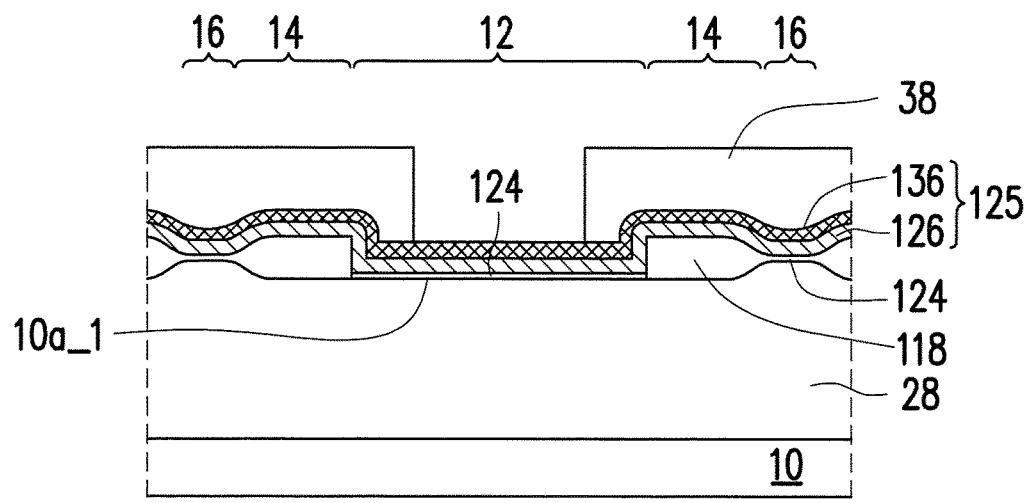
Figure 1E:
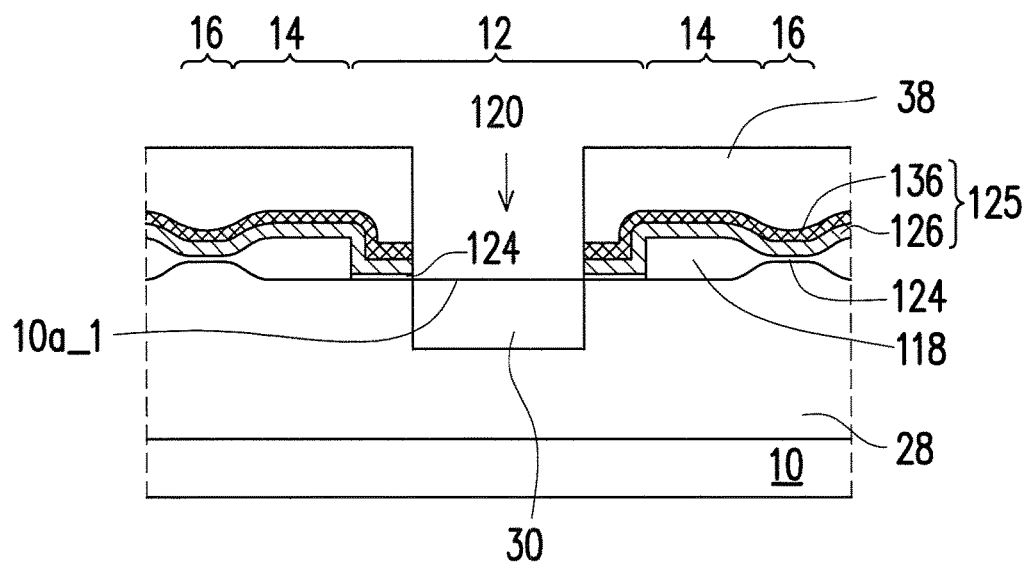

Then, referring to FIGS. 1D and 1E, an etching process is performed by using the patterned photoresist layer 38 as an etching mask, so as to pattern the gate conductive layer 125 and the gate dielectric layer 124, thereby forming an opening 120. A part of the top surface 10a_1 of the substrate 10 in the first region 12 is exposed by the opening 120. Subsequently, an ion implantation process is performed by using the patterned photoresist layer 38 as an implantation mask, so as to implant dopants of the second conductive type into the substrate 10, thereby forming a doped region 30 of the second conductive type in the substrate 10 of the first region 12.

Figure 1F:
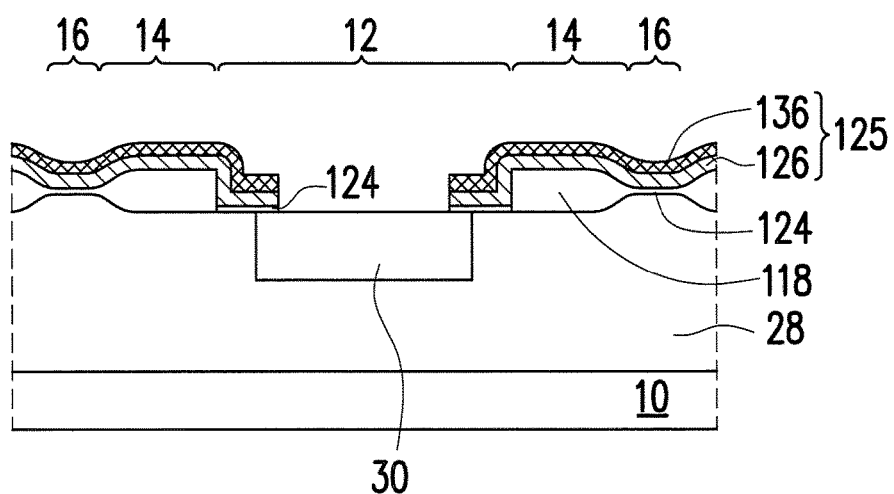

Then, referring to FIG. 1F, the patterned photoresist layer 38 is removed. Afterwards, an annealing process is performed to activate the dopants in the doped region 30.

Figure 1G:
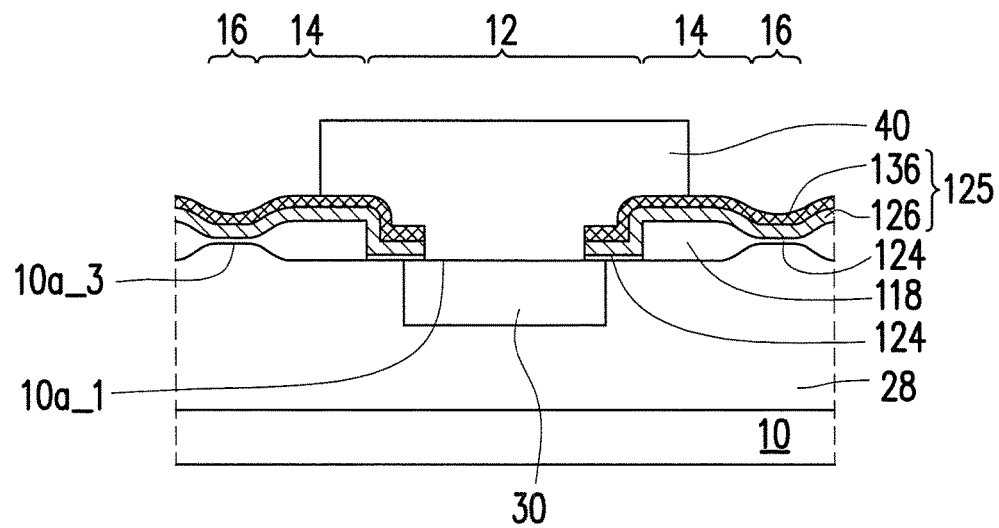

Then, referring to FIG. 1G, a photoresist layer is formed on the substrate 10. A photolithography process is then performed to form a patterned photoresist layer 40. The patterned photoresist layer 40 covers the gate conductive layer 125 located at the first region 12, a part of the doped region 30 in the substrate 10, and a part of the gate conductive layer 125 on the second region 14, while exposes a part of the gate conductive layer 125 of the second region 14 and the gate conductive layer 125 of the third region 16.

Figure 1H:
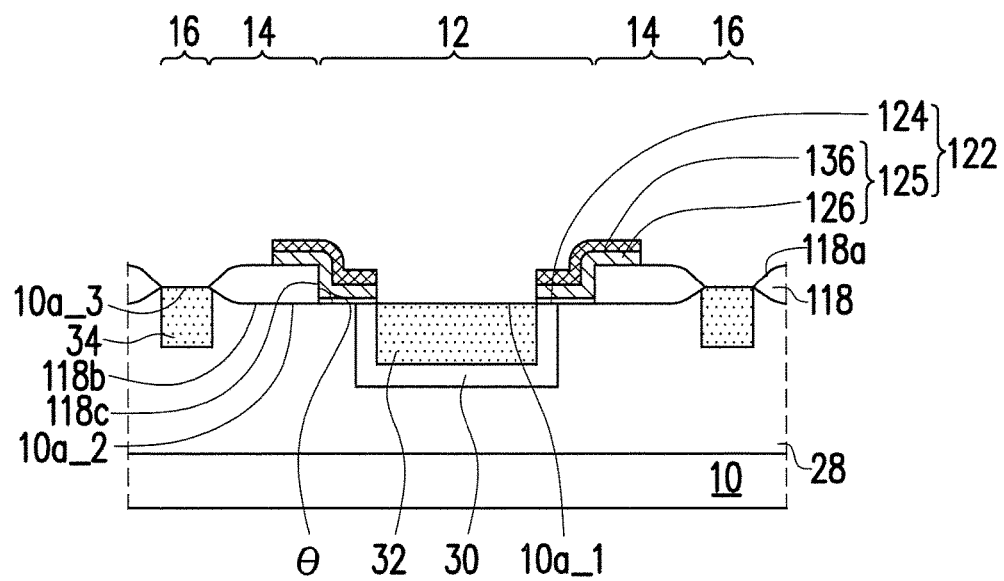

Then, referring to FIGS. 1G and 1H, the gate conductive layer 125 and the gate dielectric layer 124 are patterned again by using the patterned photoresist layer 40 as a mask, so as to form a gate structure 122. The gate structure 122 covers a part of the doped region 30 in the first region 12, extends to cover a part of the isolation structure 118 on the second region 14, and exposes a top surface 10a_3 of the substrate 10 of the third region 16, a part of the isolation structure 118 of the second region 14, and a part of the doped region 30 of the first region 12. Subsequently, a patterned photoresist layer (not shown) is formed on the substrate 10, and then an ion implantation process is performed to form a doped region 32 of the first conductive type and a doped region 34 of the first conductive type. In this embodiment, dopant concentrations of the doped regions 32 and 34 are higher than a dopant concentration of the doped region 28. In addition, a dopant concentration of the doped region 30 is higher than a dopant concentration of the second conductive type of the substrate 10. The doped region 32 is located in the doped region 30 in the first region 12 and adjacent to one side of the gate structure 122. In an embodiment of the invention, the doped region 32 may be a source region. In another embodiment of the invention, the doped region 32 may be two doped regions (not shown) of the first conductive type having a higher dopant concentration as source regions. The two source regions may have a doped region (not shown) of the second conductive type therebetween as a bulk (e.g., N+/P+/N+). In yet another embodiment, a part of the doped region 32 may be a lightly doped region (LDD), and the lightly doped region may be adjacent to the gate structure 122.

The doped region 34 is located in the doped region 28 in the third region 16 and adjacent to one side of the isolation structure 118. In an embodiment of the invention, the doped region 34 may be disposed as another drain region. In another embodiment of the invention, the doped region 34 may be served as a drift region (e.g., an N-type drift region). In addition, the doped region 34 may have another doped region (not shown) therein to be served as another drain region, and the another doped region is of the first conductive type and has a higher dopant concentration.

Referring to FIG. 1H, the semiconductor device of this embodiment, such as a laterally diffused metal oxide semiconductor (LDMOS), for example, includes the substrate 10, the isolation structure 118, the gate structure 122, the doped region 28 of the first conductive type, the doped region 30 of the second conductive type, the doped region 32 of the first conductive type, and the doped region 34 of the first conductive type. The substrate 10 includes the first region 12, the second region 14, and the third region 16. In addition, the second region 14 is located between the first region 12 and the third region 16. A height of the top surface 10a_3 of the substrate 10 in the third region 16 is higher than a height of the top surface 10a_1 of the substrate 10 in the first region 12. The isolation structure 118 has a tilted top surface 118a and is located on the second region 14 of the substrate 10. In addition, at least a part of a bottom surface 118b of the isolation structure 118 and the top surface 10a_1 of the substrate 10 in the first region 12 are substantially coplanar. In addition, the isolation structure 118 extends continuously from one end of the second region 14 close to the first region 12 to another end of the second region 14 close to the third region 16. A sidewall of at least one side of the isolation structure 118 may be substantially perpendicular to the top surface 10a_1 of the substrate 10. Alternatively, an angle between the sidewall of the at least one side of the isolation structure 118 and the top surface 10a_1 of the substrate 10 may be modified and fabricated to be an obtuse angle, for example, by controlling with an etching process, for example, based on practical needs. In an embodiment of the invention, an angle θ between a sidewall 118c of one side of the isolation structure 118 close to the first region 12 and the top surface 10a_1 of the substrate 10 is approximately a right angle or an obtuse angle. The gate structure 122 covers a part of the substrate 10 in the first region 12 and a part of the isolation structure 118 in the second region 14. The doped region 28 is located in the substrate 10 in the first region 12, the second region 14, and the third region 16. The doped region 30 is located in the doped region 28 in the first region 12. The doped region 32 is located in the doped region 30 and adjacent to one side of the gate structure 122. The doped region 34 is located in the doped region 28 in the third region 16 and adjacent to one side of the isolation structure 118.

FIGS. 2A to 2H are cross-sectional views illustrating a method of fabricating a semiconductor device according to another embodiment of the invention.

Figure 2A:
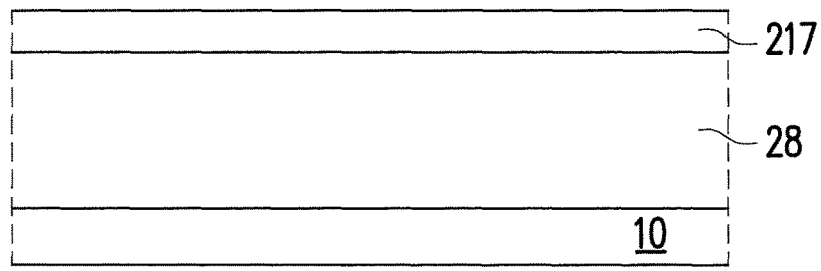
FIGS. 2A to 2H are cross-sectional views illustrating a method of fabricating a semiconductor device according to another embodiment of the invention.

Referring to FIG. 2A, first of all, an isolation structure 217 is formed on the substrate 10, and covers the first region 12, the second region 14, and the third region 16 of the substrate 10. A material of the isolation structure 217 is silicon oxide, for example. A thickness of the isolation structure 217 is from approximately 3000 Å to approximately 6000 Å, for example. A method of forming the isolation structure 217 is chemical vapor deposition, for example. In another embodiment of the invention, the method of forming the isolation structure 217 may be shallow trench isolation.

Figure 2B:
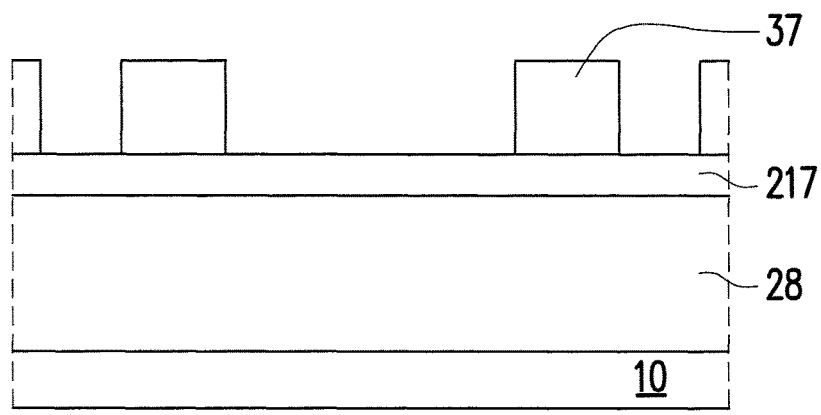
Figure 2C:
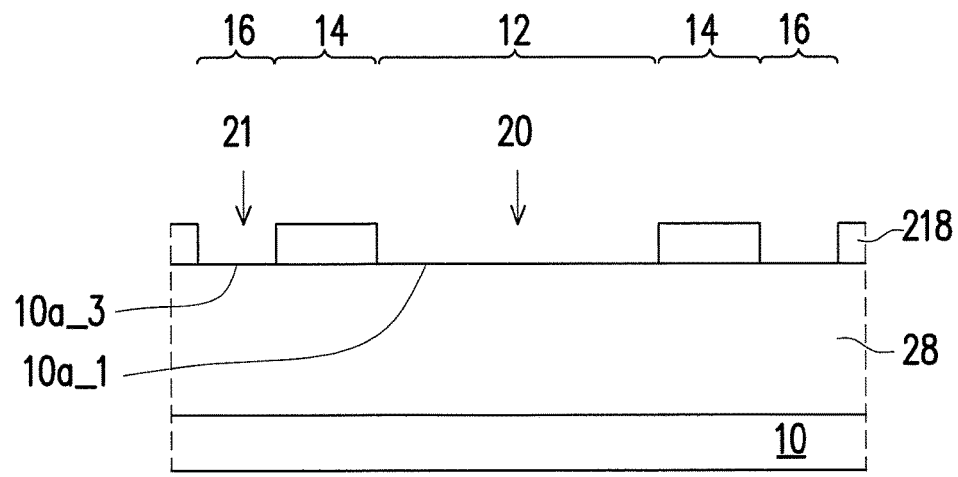
Figure 2D:
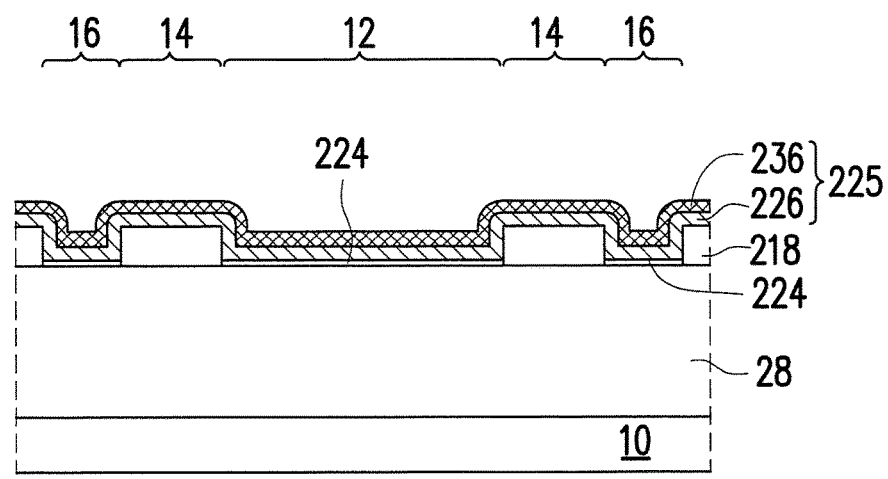
Figure 2E:
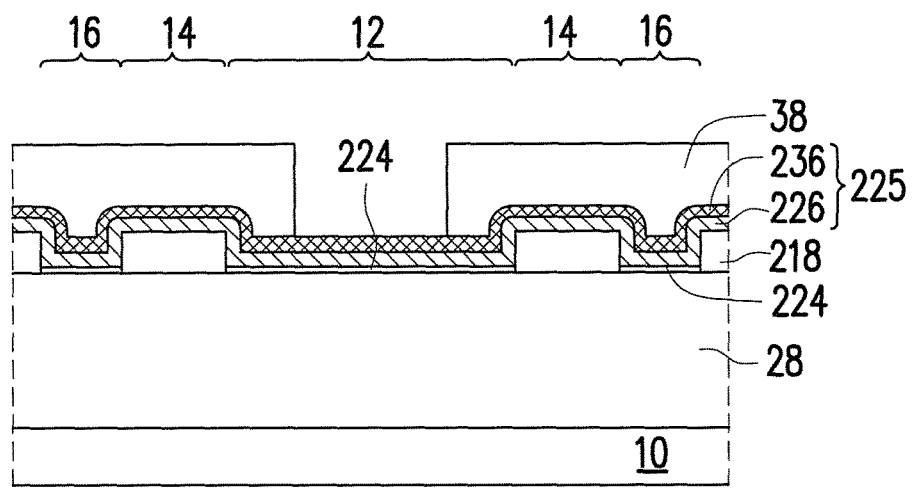
Figure 2F:
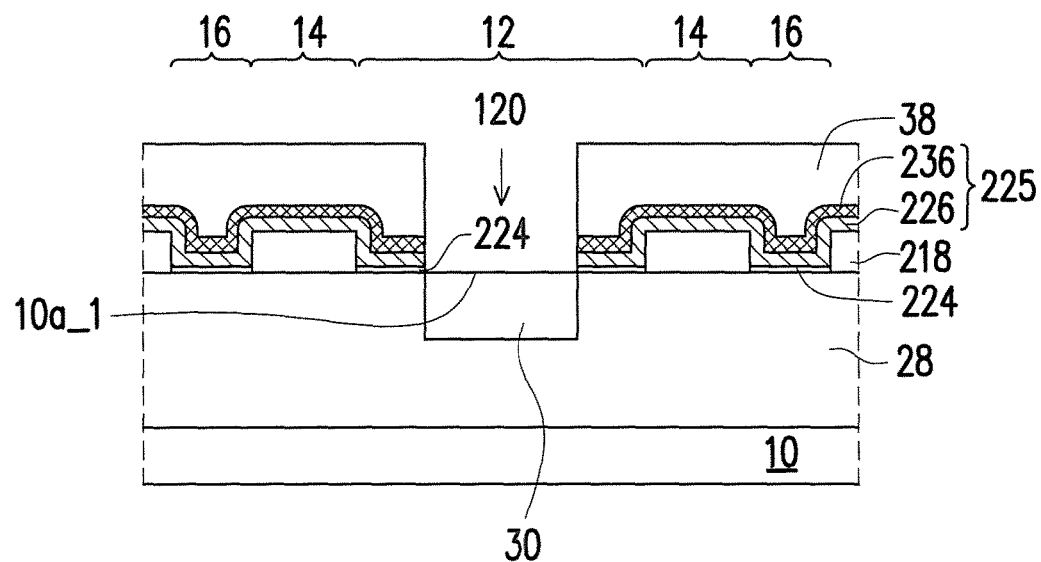
Figure 2G:
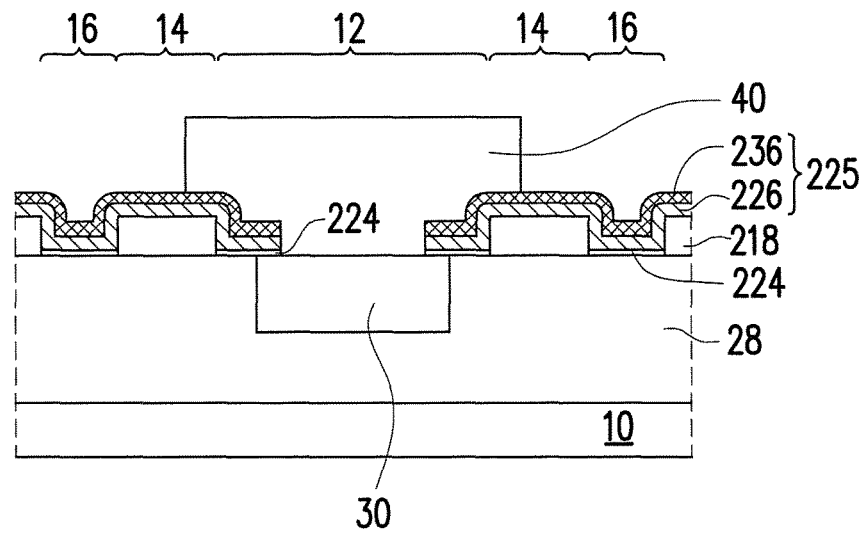

Then, referring to FIGS. 2B and 2C, the isolation structure 217 in the first region 12 and the third region 16 is removed by performing a removing process. More specifically, referring to FIG. 2B, a photoresist layer (not shown) is formed on the isolation structure 217. Then, a photolithography process is performed to form the patterned photoresist layer 37. Thereafter, referring to FIG. 2C, the isolation structure 217 is etched by using the patterned photoresist layer 37 as an etching mask, so as to form an isolation structure 218 having the first opening 20 and a second opening 21. The first opening 20 and the second opening 21 respectively expose the top surface 10a_1 of the substrate 10 in the first region 12 and the top surface 10a_3 of the substrate 10 in the third region 16. Then, the patterned photoresist layer 37 is removed.

Then, referring to FIGS. 2D to 2H, subsequent processes are the same as the processes of the embodiment above corresponding to FIGS. 1D to 1H. Therefore, the details will not be reiterated below.

Figure 2H:
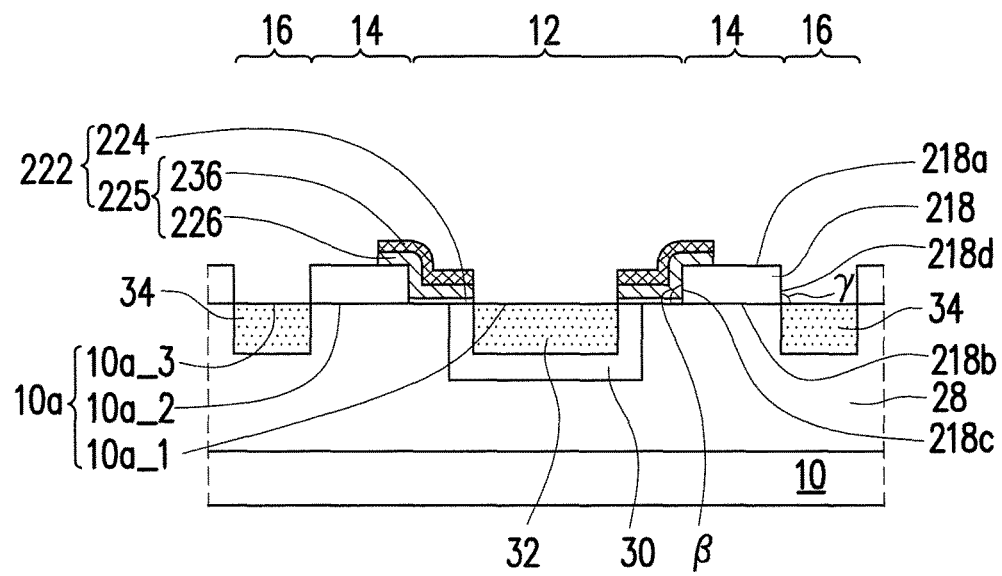

Referring to FIG. 2H, the semiconductor device of this embodiment, such as a laterally diffused metal oxide semiconductor, for example, includes the substrate 10, the isolation structure 218, the gate structure 222, the doped region 28 of the first conductive type, the doped region 30 of the second conductive type, the doped region 32 of the first conductive type, and the doped region 34 of the first conductive type. The substrate 10 includes the first region 12, the second region 14, and the third region 16. The second region 14 is located between the first region 12 and the third region 16. The top surface 10a_1 of the substrate 10 in the first region 12, a top surface 10a_2 of the substrate 10 in the second region 14, and the top surface 10a_3 of the substrate 10 in the third region 16 are substantially conplanar. The isolation structure 218 has a flat top surface 218a located on the substrate 10 in the second region 14. In addition, a bottom surface of 218b of the isolation structure 218 and the top surface 10a_2 of the substrate 10 in the second region 14 are also substantially conplanar. Namely, the bottom surface 218b of the isolation structure 218 and the top surface 10a of the substrate 10 are substantially conplanar. In addition, the isolation structure 218 continuously extends from one end of the second region 14 close to the first region 12 to another end of the second region 14 close to the third region 16. In an embodiment, an angle β between a sidewall 218c of one side of the isolation structure 218 close to the first region 12 and the top surface 10a of the substrate 10 may be a right angle or may be modified and fabricated to be an obtuse angle, for example, by controlling with an etching process, for example, based on practical needs. In addition, an angle γ between a sidewall 218d of one side of the isolation structure 218 close to the third region 16 and the top surface 10a of the substrate 10 may be a right angle or may be modified and fabricated to be an obtuse angle, for example, by controlling with an etching process, for example, based on practical needs. The gate structure 222 covers a part of the substrate 10 in the first region 12 and a part of the isolation structure 218 in the second region 14. The doped region 28 is located in the substrate 10 in the first region 12, the second region 14, and the third region 16. The doped region 30 is located in the doped region 28 in the first region 12. The doped region 32 is located in the doped region 30 and adjacent to one side of the gate structure 222. The doped region 34 is located in the doped region 28 of the third region 16 and adjacent to one side of the isolation structure 218.

FIGS. 3A to 3H are cross-sectional views illustrating a method of fabricating a semiconductor device according to still another embodiment of the invention.

Figure 3A:
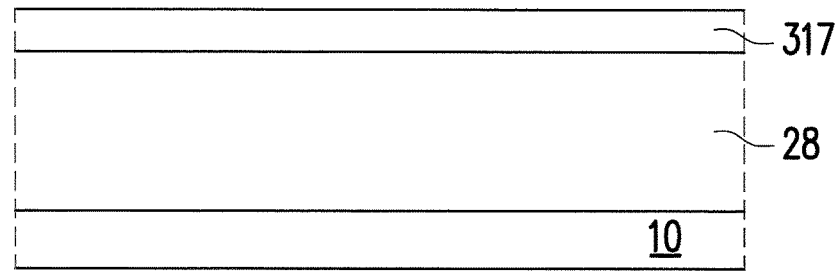
FIGS. 3A to 3H are cross-sectional views illustrating a method of fabricating a semiconductor device according to still another embodiment of the invention.

First of all, referring to FIG. 3A, an isolation structure 317 is formed on the substrate 10. The isolation structure 317 covers the substrate 10 in the first region 12, the second region 14, and the third region 16. A material of the isolation structure 317 is silicon oxide, for example. A method of forming the isolation structure 317 is chemical vapor deposition, for example. A thickness of the isolation structure 317 is from approximately 3000 Å to approximately 6000 Å. In another embodiment of the invention, the method of forming the isolation structure 317 may be shallow trench isolation.

Figure 3B:
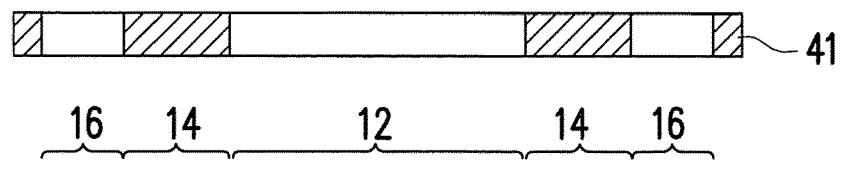
Figure 3B:
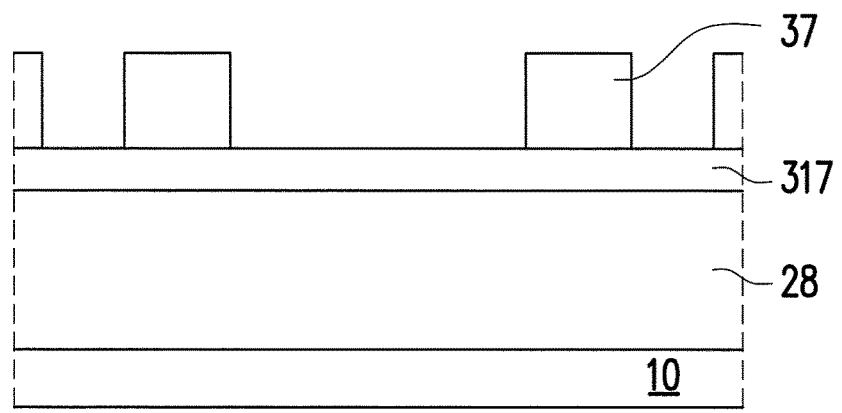
Figure 3C:
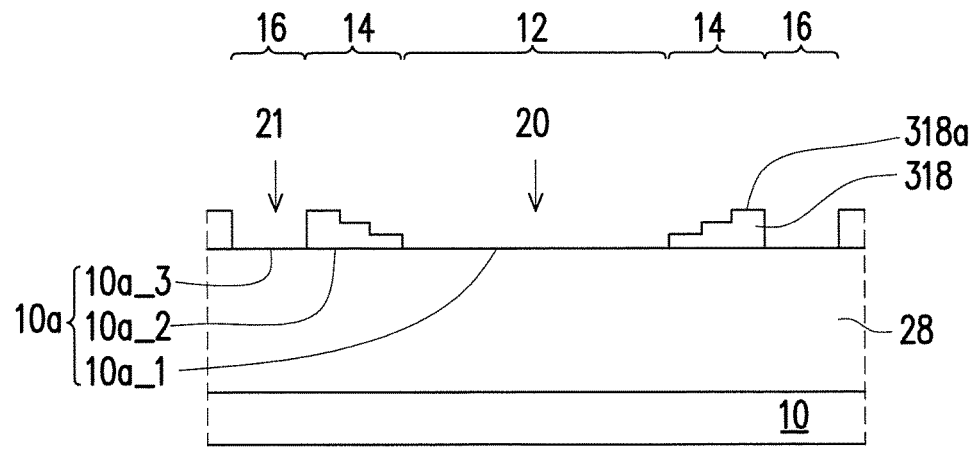
Figure 3D:
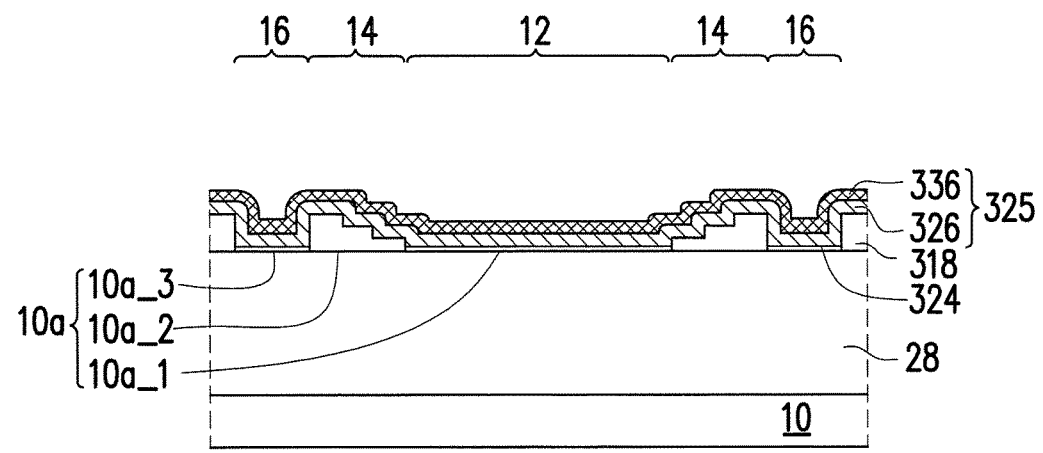
Figure 3E:
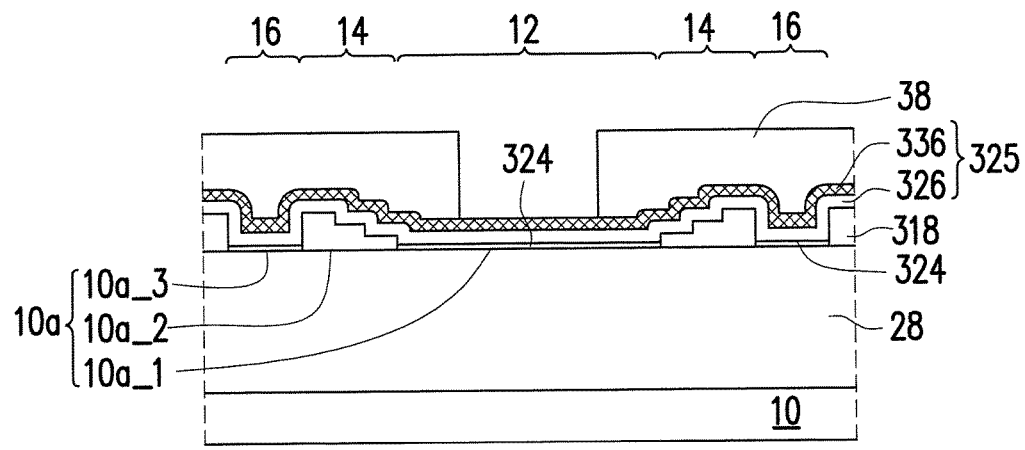
Figure 3F:
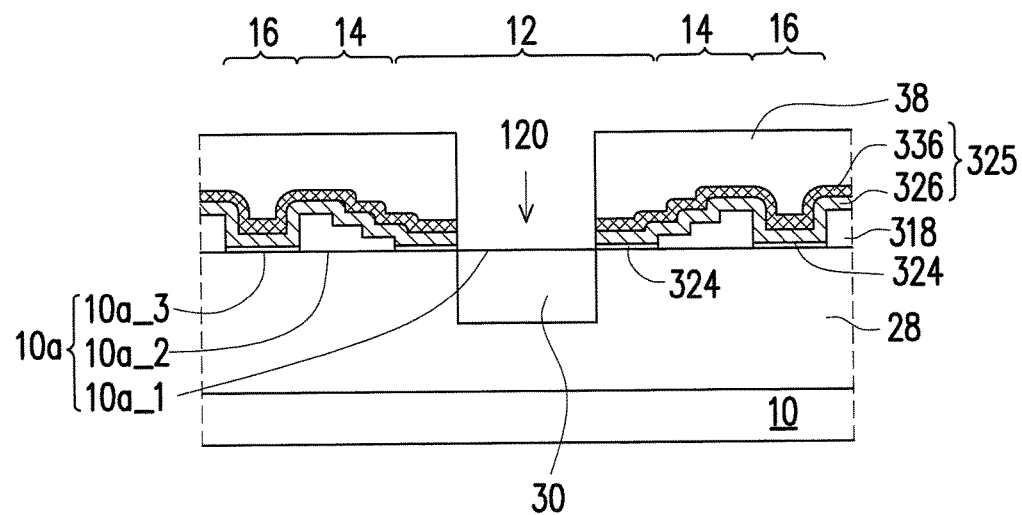
Figure 3G:
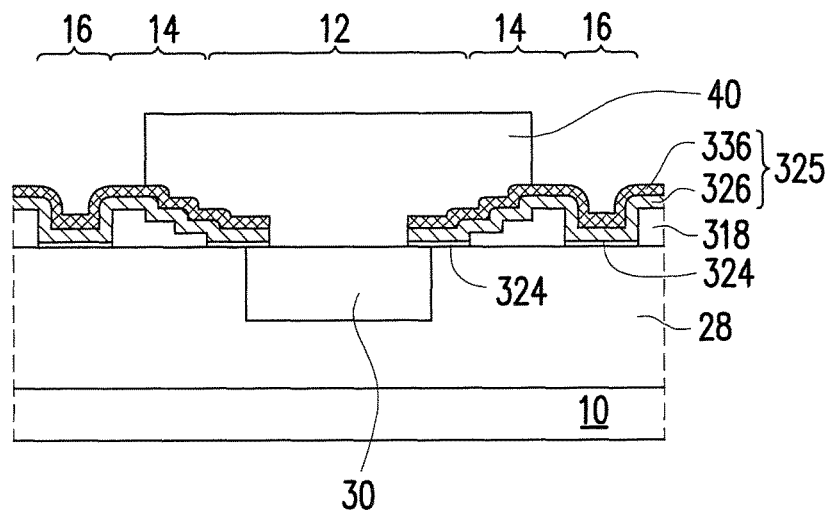

Then, referring to FIGS. 3B and 3C, a removing process is performed to remove the isolation structure 317 in the first region 12 and the third region 16; thereby a rendered isolation structure 318 having a step-like top surface 318a is formed. More specifically, referring to FIG. 3B, a photoresist layer (not shown) is formed on the isolation structure 317. Then, a patterned photoresist layer 37 is formed by performing exposure and development processes to the photoresist layer using a photomask 41.

Thereafter, referring to FIG. 3C, the isolation structure 317 is etched by using the patterned photoresist layer 37 as an etching mask, so as to form an isolation 318 having the first opening 20 and the second opening 21. The isolation structure 318 covers the top surface 10a_2 of the substrate 10 in the second region 14. More specifically, a surface of the isolation structure 318 is a step-like top surface 318a. The first opening 20 and the second opening 21 respectively expose the top surface 10a_1 and the top surface 10a_3 of the substrate 10. Then, the patterned photoresist layer 37 is removed. In this embodiment, the photomask 41 may be a progressive photomask, and the patterned photoresist layer 37 may be formed by performing one exposure process and one development process. However, the invention is not limited thereto. In another embodiment, the same configuration may be fabricated by performing a plurality of exposure process and a plurality of development process using a plurality of photomasks.

Then, referring to FIGS. 3D to 3H, subsequent processes are the same as the processes of the embodiment above corresponding to FIGS. 1D to 1H. Therefore, the details will not be reiterated below.

Figure 3H:
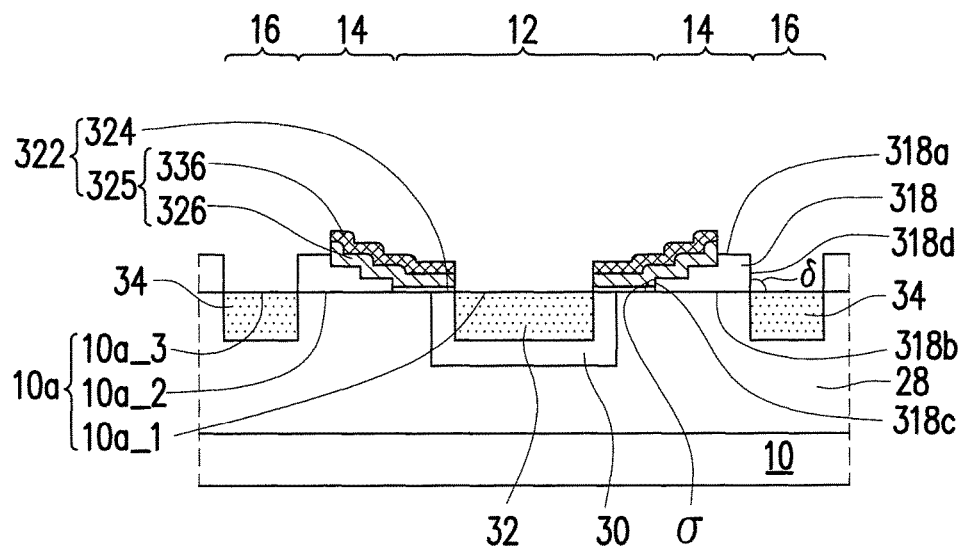

Referring to FIG. 3H, the semiconductor device of this embodiment, such as a laterally diffused metal oxide semiconductor, for example, includes the substrate 10, the isolation structure 318, the gate structure 322, the doped region 28 of the first conductive type, the doped region 30 of the second conductive type, the doped region 32 of the first conductive type, and the doped region 34 of the first conductive type. The substrate 10 includes the first region 12, the second region 14, and the third region 16. The second region 14 is located between the first region 12 and the third region 16. The top surface 10a_1 of the substrate 10 in the first region 12, the top surface 10a_2 of the substrate 10 in the second region 14, and the top surface 10a_3 of the substrate 10 in the third region 16 are substantially coplanar. The isolation structure 318 is located on the substrate 10 in the second region 14 and has the step-like top surface 318a. In addition, a bottom surface of 318b of the isolation structure 318 and the top surface 10a_2 of the substrate 10 in the second region 14 are substantially coplanar. Namely, the bottom surface 318b of the isolation structure 318 and the top surface 10a of the substrate 10 are substantially coplanar. In addition, the isolation structure 318 continuously extends from one end of the second region 14 close to the first region 12 to another end of the second region 14 close to the third region 16. In an embodiment, an angle σ between a sidewall 318c of one side of the isolation structure 318 close to the first region 12 and the top surface 10a of the substrate 10 may be a right angle or may be modified and fabricated to be an obtuse angle, for example, by controlling with an etching process, for example, based on practical needs. In addition, an angle δ between a sidewall 318d of one side of the isolation structure 318 close to the third region 16 and the top surface 10a of the substrate 10 may be a right angle or may be modified and fabricated to be an obtuse angle, for example, by controlling with an etching process, for example, based on practical needs. The gate structure 322 also has a step-like surface and covers a part of the substrate 10 in the first region 12 and a part of the isolation structure 318 in the second region 14. The doped region 28 is located in the substrate 10 in the first region 12, the second region 14, and the third region 16. The doped region 30 is located in the doped region 28 in the first region 12. The doped region 32 is located in the doped region 30 and adjacent to one side of the gate structure 322. The doped region 34 is located in the doped region 28 in the third region 16 and adjacent to one side of the isolation structure 318.

In the fabricating process of the semiconductor device according to the embodiments of the invention, at least a part of the bottom surfaces 118b, 218b, and 318b of the isolation structures 118, 218, and 318 and the top surface 10a of the substrate 10 are substantially coplanar, respectively. Therefore, a length of a current path from the doped region 32 to the doped region 34, which is equivalent to a distance from the source region to the drain region or from the drain region to the source region, may be reduced, so as to improve the on-state resistance. Below, the effects of the embodiments of the invention are tested with simulated examples.

Figure 4A:
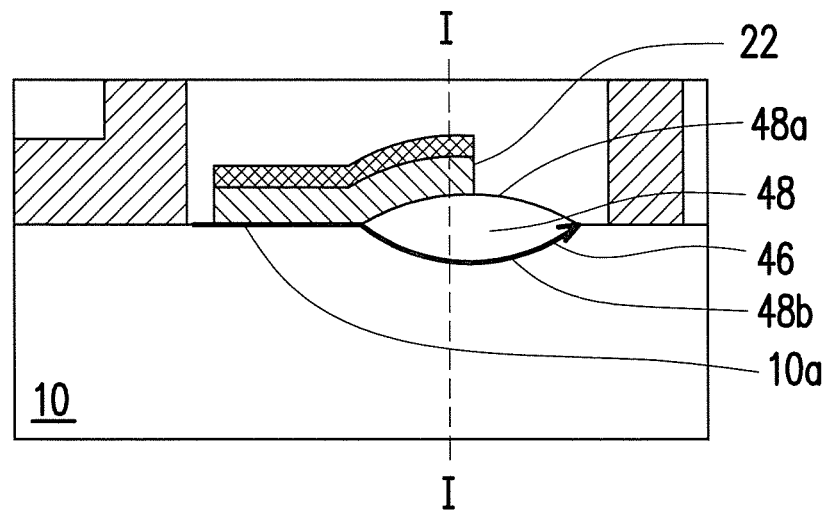
FIG. 4A is a partial cross-sectional enlarged view of a semiconductor device of a comparative example.
Figure 4B:
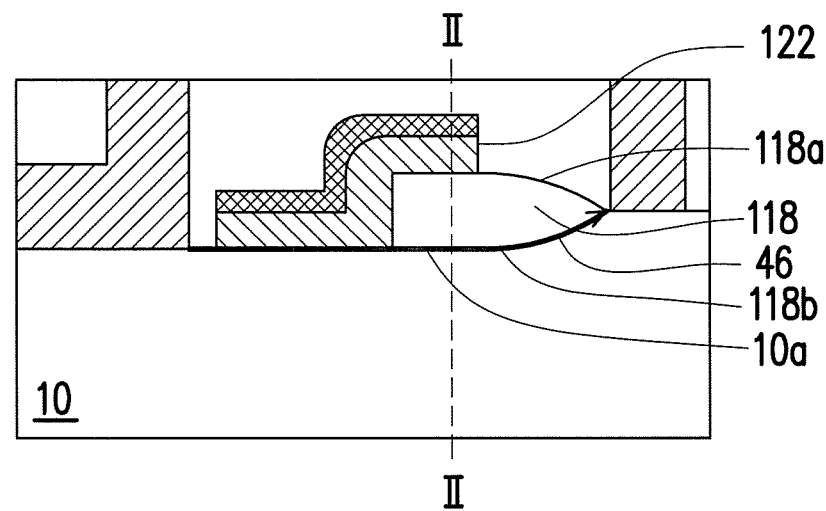
FIG. 4B is a partial cross-sectional enlarged view of a semiconductor device of Example 1 of the invention.
Figure 4C:
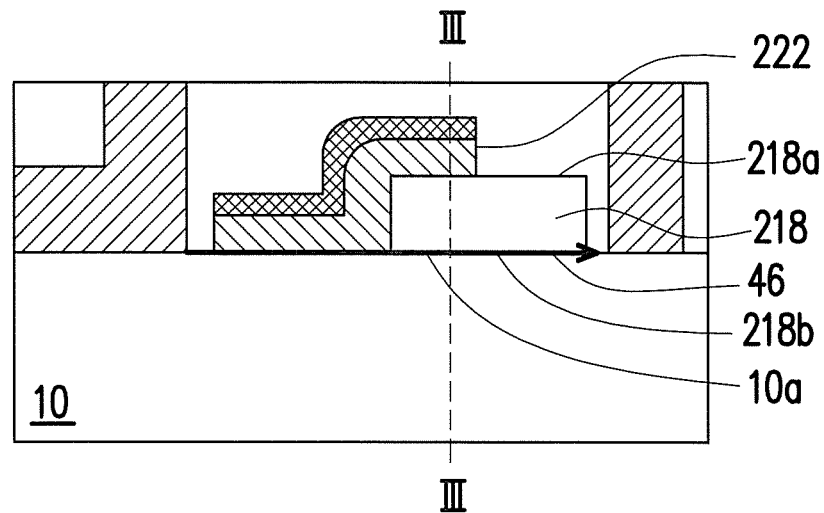
FIG. 4C is a partial cross-sectional enlarged view of a semiconductor device of Example 2 of the invention.
Figure 4D:
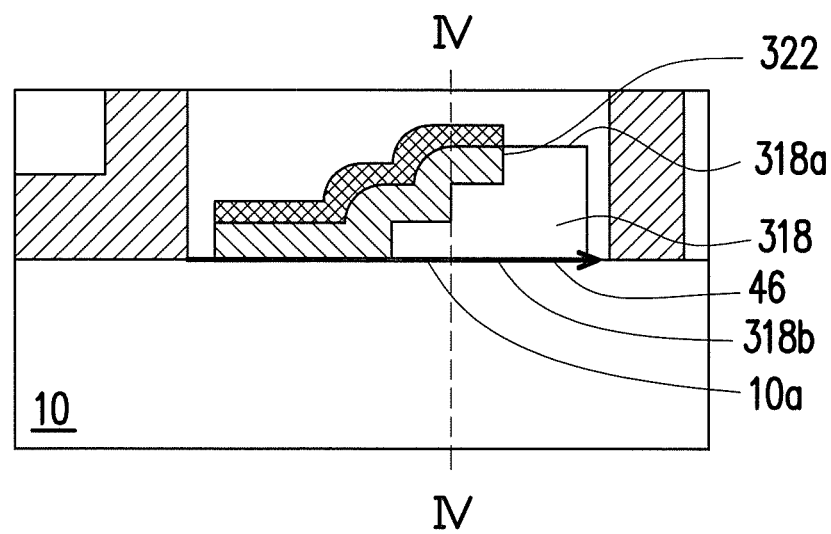
FIG. 4D is a partial cross-sectional enlarged view of a semiconductor device of Example 3 of the invention.

FIG. 4A is a partial cross-sectional enlarged view of a semiconductor device of a comparative example. FIG. 4B is a partial cross-sectional enlarged view of a semiconductor device of Example 1. FIG. 4C is a partial cross-sectional enlarged view of a semiconductor device of Example 2. FIG. 4D is a partial cross-sectional enlarged view of a semiconductor device of Example 3.

Referring to FIGS. 4A to 4D, in the semiconductor devices shown in FIGS. 4A to 4D, the gate structures 22, 122, 222, and 322 and the isolation structures 48, 118, 218, and 318 are formed. An arrow sign 46 indicates a direction of an electron flow of a device in the on-state. In addition, the direction of the electron flow is opposite to a current direction. The bottom surface 48b of the isolation structure 48 of the semiconductor device in the comparative example (FIG. 4A) is in an arc shape and is not substantially coplanar with the top surface 10a of the substrate 10. In Example 1 (FIG. 4B), a part of the bottom surface 118b of the isolation structure 118 and the top surface 10a of the substrate 10 are substantially coplanar. In Example 2 (FIG. 4C), the bottom surface 218b of the isolation structure 218 and the top surface 10a of the substrate 10 are substantially coplanar. In Example 3 (FIG. 4D), the bottom surface 318b of the isolation structure 318 and the top surface 10a of the substrate 10 are substantially coplanar. Based on a direction of charges represented by the arrow sign 46, lengths of current paths of the semiconductor devices in Examples 1-3 (FIGS. 4B to 4D) are shorter as compared with a length of a current path in the semiconductor device of the comparative example (FIG. 4A), since at least a part of the bottom surfaces 118b, 218b, and 318b of the isolation structures 118, 218, and 318 in the semiconductor devices of Examples 1 to 3 (FIGS. 4B to 4D) and the top surface 10a of the substrate 10 are substantially coplanar, respectively.

Figure 5:
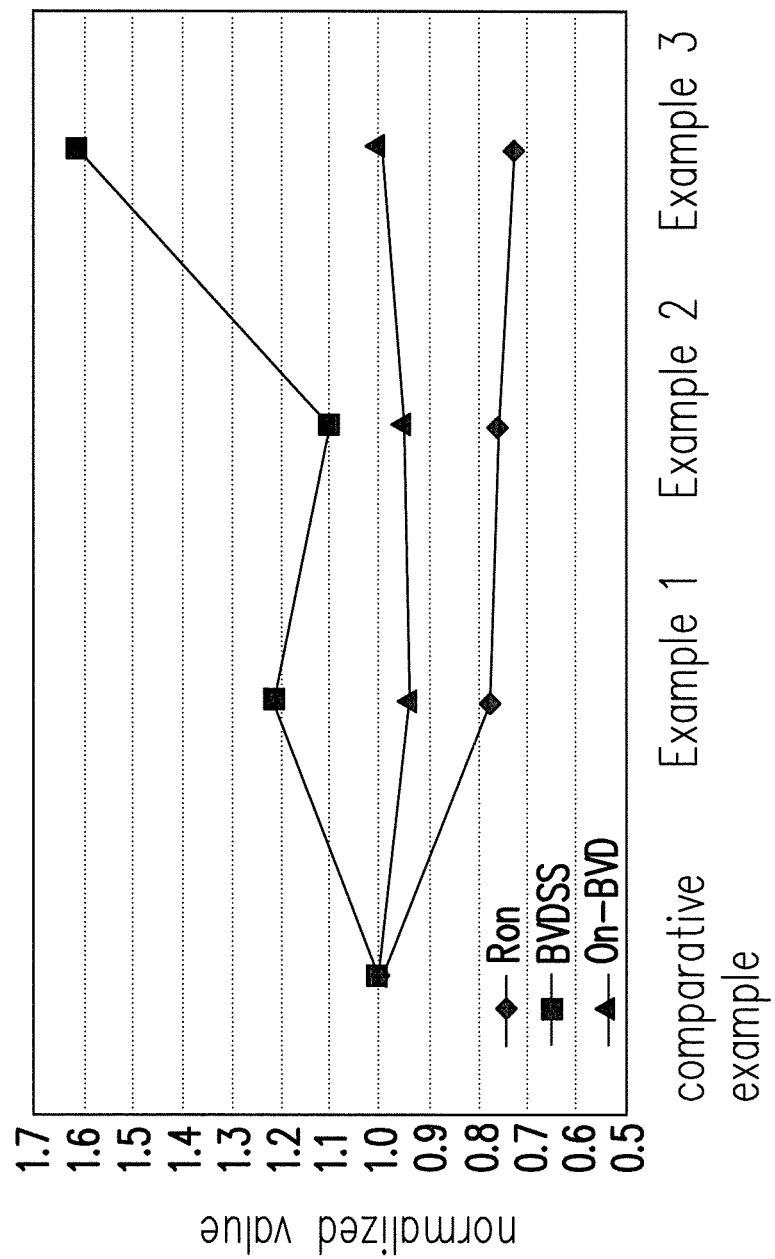
FIG. 5 is a simulation diagram for on-state resistances Ron, on-state breakdown voltages (on-BVD), and off-state breakdown voltages (BVDSS) of the semiconductor device along a cross-sectional line I-I shown in FIG. 4A, the semiconductor device along a cross-sectional line II shown in FIG. 4B, the semiconductor device along a cross-sectional line shown in FIG. 4C, and the semiconductor device along a cross-sectional line IV-IV shown in FIG. 4D.

FIG. 5 is a simulation diagram for on-state resistances Ron, on-state breakdown voltages on-BVD, and off-state breakdown voltages BVDSS of the semiconductor device along a cross-sectional line I-I shown in FIG. 4A (comparative example), the semiconductor device along a cross-sectional line II shown in FIG. 4B (Example 1), the semiconductor device along a cross-sectional line shown in FIG. 4C (Example 2), and the semiconductor device along a cross-sectional line IV-IV shown in FIG. 4D (Example 3).

Values of the on-state resistances, on-state breakdown voltages, and off-state breakdown voltages of FIG. 5 are normalized based on simulated data of the semiconductor device of FIG. 4A. Referring to FIGS. 4A to 4D and FIG. 5 at the same time, regarding the on-state breakdown voltages, the semiconductor devices of FIGS. 4B to 4D are substantially similar to the semiconductor of FIG. 4A. However, values of the on-state resistances in the three embodiments of Examples 1-3 (FIGS. 4B to 4D) are significantly lower than a value of the on-state resistance of the semiconductor device of the comparative example (FIG. 4A). More specifically, the values of the on-state resistances of the semiconductor devices of Examples 1, 2, and 3 (FIGS. 4B, 4C, and 4D) are respectively lower than the value of the on-state resistance of the semiconductor device of the comparative example (FIG. 4A) by approximately 22%, 25%, and 27%, respectively. In addition, compared with a value of the off-state breakdown voltage of the semiconductor device of the comparative example (FIG. 4A), values of the off-state breakdown voltages of the semiconductor devices of Examples 1, 2, and 3 (FIGS. 4B, 4C, and 4D) are higher by approximately 21%, 10%, and 60%, respectively. The embodiments of the invention are not only suitable for an N-type LDMOS device but also suitable for a P-type LDMOS device.

FIGS. 6A, 6B, 6C, and 6D are simulation diagrams for potential distributions of the semiconductor devices of FIGS. 4A, 4B, 4C, and 4D in the off-state, respectively.

Figure 6B:
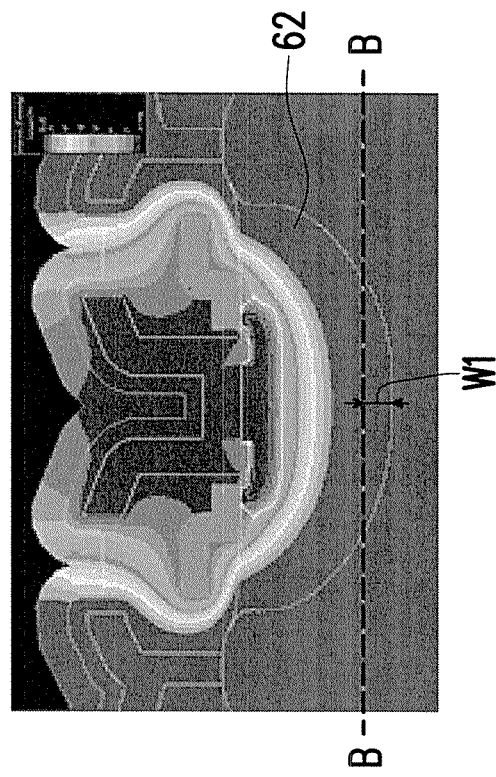
FIG. 6B is a simulation diagram for a potential distribution of the semiconductor device of Example 1 shown in FIG. 4B in the off-state.
Figure 6A:
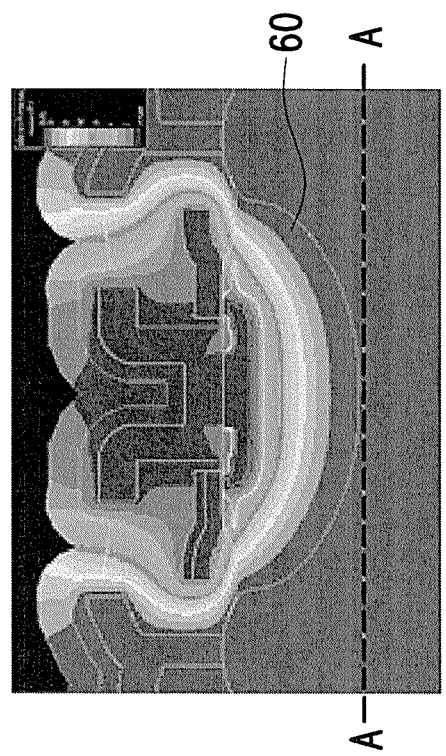
FIG. 6A is a simulation diagram for a potential distribution of the semiconductor device of the comparative example shown in FIG. 4A in the off-state.
Figure 6C:
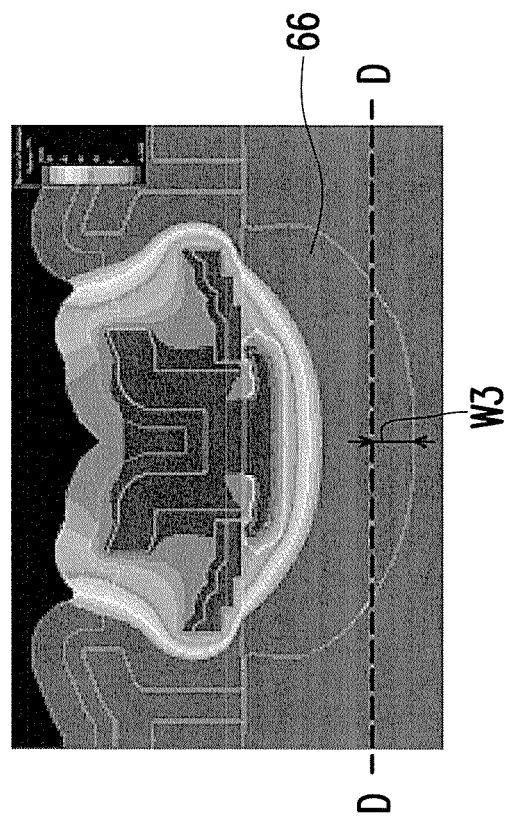
FIG. 6C is a simulation diagram for a potential distribution of the semiconductor device of Example 2 shown in FIG. 4C in the off-state.
Figure 6D:
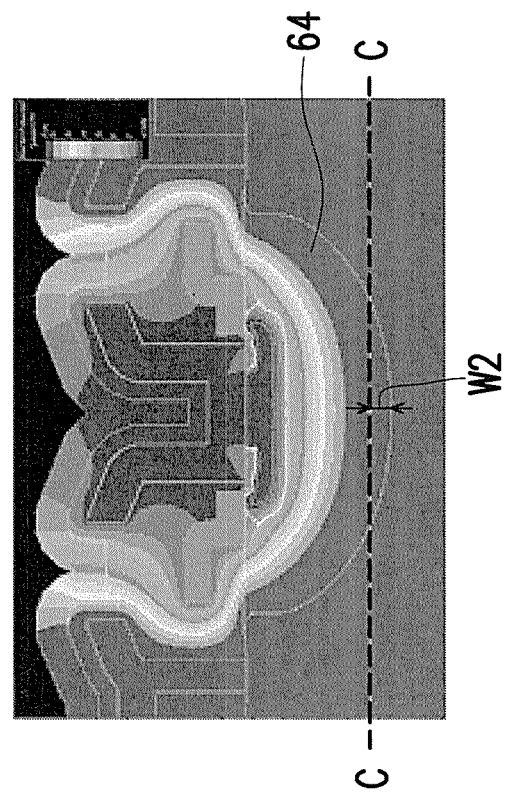
FIG. 6D is a simulation diagram for a potential distribution of the semiconductor device of Example 3 shown in FIG. 4D in the off-state.

Referring to FIGS. 4A to 4D and FIGS. 6A to 6D at the same time, distances from lines A-A, B-B, C-C, and D-D to the surface of the substrate are the same. Compared with a depletion region 60 of the semiconductor device of the comparative example (FIG. 4A), depletion regions 62, 64, and 66 of the semiconductor devices of Examples 1, 2 and 3 (FIGS. 4B, 4C, and 4D, respectively) have wider breadths, and breadths that are added are W1, W2, and W3, respectively. Referring to FIG. 6D, the depletion region 66 corresponding to semiconductor device having the step-like isolation structure corresponding to Example 3 (FIG. 4D) has the widest width. In other words, the off-state breakdown voltage of the semiconductor device of Example 3 is the highest.

Figure 7A:
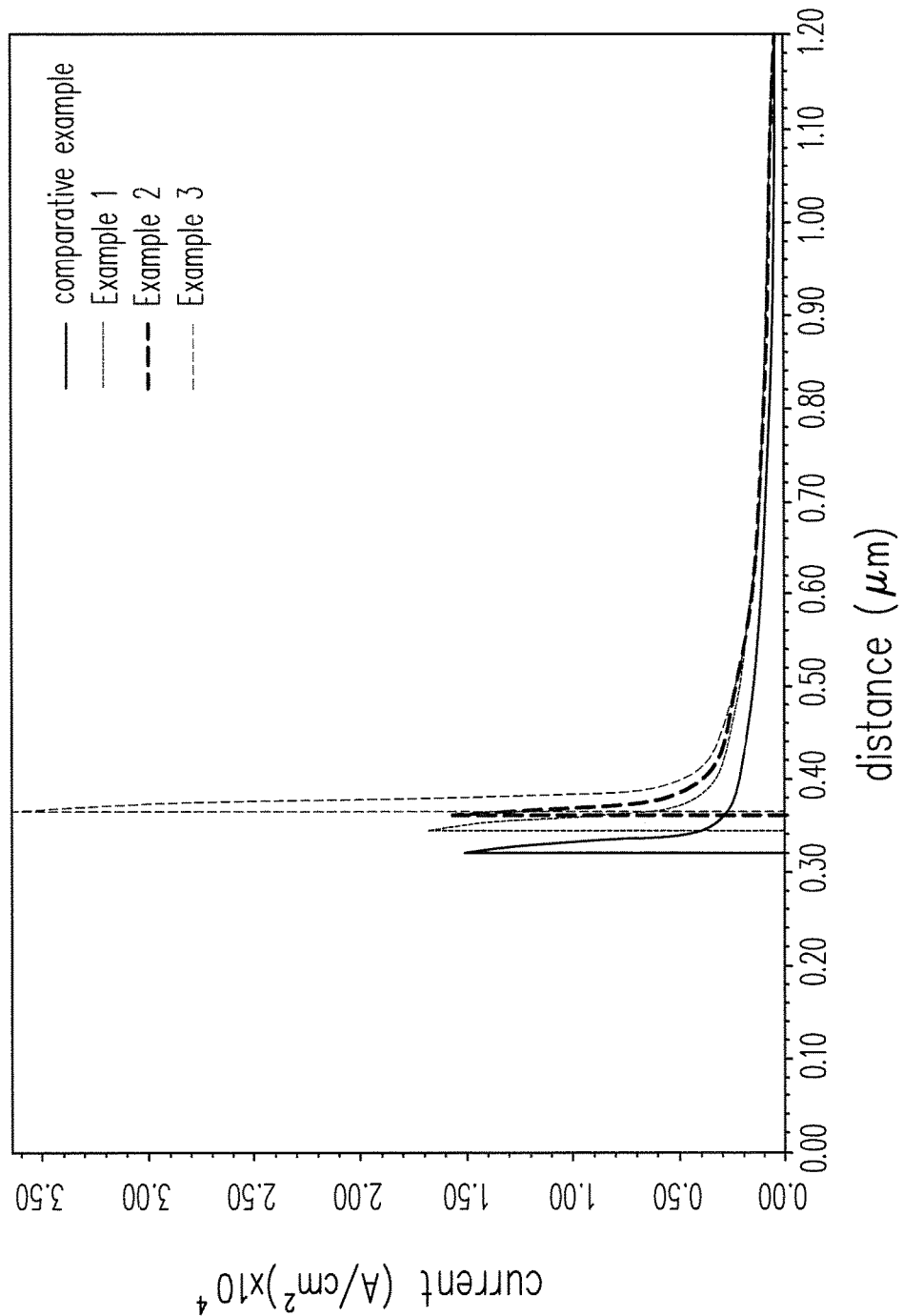
FIG. 7A is a simulation diagram for current densities in the on-state of the semiconductor device along the cross-sectional line I-I shown in FIG. 4A, the semiconductor device along the cross-sectional line II-II shown in FIG. 4B, the semiconductor device along the cross-sectional line shown in FIG. 4C and the semiconductor device along the cross-sectional line IV-IV shown in FIG. 4D.

FIG. 7A is a simulation diagram for current densities in the on-state of the semiconductor device of the comparative example along the cross-sectional line I-I shown in FIG. 4A, the semiconductor device of Example 1 along the cross-sectional line II-II shown in FIG. 4B, the semiconductor device of Example 2 along the cross-sectional line shown in FIG. 4C and the semiconductor device of Example 3 along the cross-sectional line IV-IV shown in FIG. 4D.

Referring to FIGS. 4A to 4D and FIG. 7A at the same time, a vertical axis represents a current density, while a horizontal axis, from left to right, respectively represent distances from the top surfaces 48a, 118a, 218a, and 318a to a bottom surface (not shown) of the substrate in the embodiments. Total current densities of the semiconductor devices of Examples 1-3 (FIGS. 4B to 4D) are respectively greater than a total current density of the semiconductor device of the comparative example (FIG. 4A). Since at least a part of the bottom surfaces 118b, 218b, and 318b of the isolation structures 118, 218, and 318 and the top surface 10a of the substrate 10 are substantially coplanar, respectively, the total current densities of the semiconductor devices of Examples 1-3 (FIGS. 4B to 4D) are respectively higher than the total current density of the semiconductor device of the comparative example by at least 32.5%.

Figure 7B:
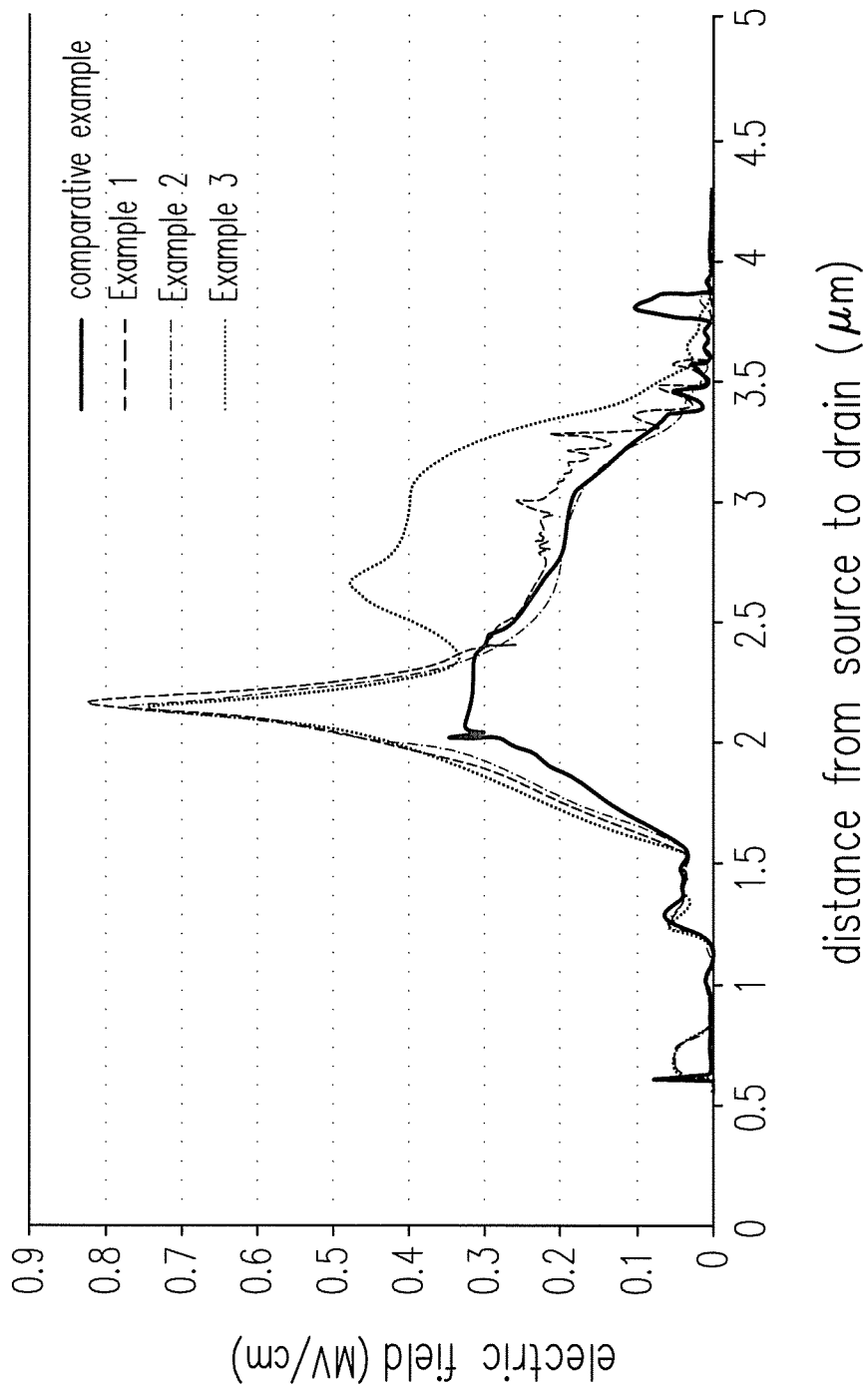
FIG. 7B is a diagram illustrating electric field distributions in the off-state of the semiconductor device of FIG. 6A along a cross-sectional line A-A, the semiconductor device of FIG. 6B along a cross-sectional line B-B, the semiconductor device of FIG. 6C along a cross-sectional line C-C, and the semiconductor device of FIG. 6D along a cross-sectional line D-D.

FIG. 7B is a diagram illustrating electric field distributions in the off-state of the semiconductor device of FIG. 6A along a cross-sectional line A-A, the semiconductor device of FIG. 6B along a cross-sectional line B-B, the semiconductor device of FIG. 6C along a cross-sectional line C-C, and the semiconductor device of FIG. 6D along a cross-sectional line D-D.

Referring to FIG. 7B, maximums of the electric field (i.e., the electric field value measured when a semiconductor device breaks down) of the semiconductor devices of Examples 1-3 (FIGS. 6B to 6D) are respectively higher than a maximum of the electric field of the semiconductor device of the comparative example (FIG. 6A). Compared to the maximum of the electric field of the semiconductor device of the comparative example (FIG. 6A), which is approximately 0.3 MVcm$^{-1}$, the maximums of the electric field of the semiconductor devices of Examples 1-3 (FIG. 6B to 6D) are increased to approximately 0.8 MVcm$^{-1}$, respectively. In addition, compared to the comparative example, the semiconductor devices of Example 1 and Example 2, Example 3 (FIG. 6D), which has the step-like isolation structure, have a larger depletion region at a side close to the drain region, so the side close to the drain region has a higher maximums of the electric field.

In view of the foregoing, since at least a part of the bottom surface of the isolation structure and the top surface of the substrate are substantially coplanar according to the embodiments of the invention, the length of the current path from the source region to the drain region is reduced. In addition, since the semiconductor device according to the embodiments of the invention has a larger depletion region, the semiconductor device according to the embodiments of the invention has an improved on-state resistance, increased breakdown voltage, and improved device performance. Moreover, the embodiment having a step-like isolation structure of the invention has an even more preferable on-state total current and the maximum of the electric field in the off-state. In addition, the device performance may be improved by additionally performing a process using a progressive photomask.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A semiconductor device, comprising:
   a substrate, comprising a first region, a second region, and a third region, wherein the second region is located between the first region and the third region;
   an isolation structure, located in the second region of the substrate, the isolation structure comprising a top surface, a bottom surface, and a sidewall, the sidewall of the isolation structure being substantially perpendicular to a top surface of the substrate and connecting the top surface and the bottom surface at a first side of the isolation structure, wherein at least a part of the bottom surface of the isolation structure and the top surface of the substrate are substantially coplanar, and the isolation structure continuously extends from one end of the second region to another end of the second region;
   a gate structure, disposed at the first side of the isolation structure and extending from a part of the substrate in the first region to cover the sidewall of the isolation structure and a part of the isolation structure in the second region;
   a first doped region of a first conductive type, located in the substrate in the first region, and adjacent to one side of the gate structure; and
   a second doped region of the first conductive type, located in the substrate in the third region, and exposed by a second side of the isolation structure,
   wherein a level of the top surface of the isolation structure gradually decreases from the first side of the isolation structure toward the second side of the isolation structure, a level of the bottom surface of the isolation structure gradually increases from the first side of the isolation structure toward the second side of the isolation structure, and the top surface of the isolation structure and the bottom surface of the isolation structure are connected at the second side of the isolation structure.

2. The semiconductor device as claimed in claim 1, wherein the bottom surface of the isolation structure and the top surface of the substrate in the first region are substantially coplanar.

3. The semiconductor device as claimed in claim 2, wherein a height of the top surface of the substrate in the third region is greater than a height of the top surface of the substrate in the first region.

4. The semiconductor device as claimed in claim 2, wherein the isolation structure has a flat top surface or a tilted top surface.

5. The semiconductor device as claimed in claim 1, further comprising a third doped region of a second conductive type, wherein the third doped region is located in the substrate in the first region, and the first doped region is located in the third doped region.

6. The semiconductor device as claimed in claim 5, further comprising a fourth doped region of the first conductive type, wherein the fourth doped region is located in the substrate in the first region, the second region, and the third region, and the third doped region and the second doped region are located in the fourth doped region.

7. The semiconductor device as claimed in claim 1, wherein an angle between the sidewall of the first side of the isolation structure and the top surface of the substrate is a right angle or an obtuse angle.

8. The semiconductor device as claimed in claim 1, wherein the isolation structure is only covered by one gate structure.

9. A semiconductor device, comprising:
   a substrate, comprising a first region, a second region, and a third region, wherein the second region is located between the first region and the third region;
   an isolation structure, located on the substrate in the second region, the isolation structure comprising a top surface, a bottom surface, and a sidewall, the sidewall of the isolation structure being substantially perpendicular to a top surface of the substrate and connecting the top surface and the bottom surface at a second side of the isolation structure, and the top surface of the isolation structure being a step-like top surface, wherein at least a part of the bottom surface of the isolation structure and the top surface of the substrate are substantially coplanar, and the isolation structure continuously extends from one end of the second region to another end of the second region;
   a gate structure, disposed at a first side of the isolation structure and extending from a part of the substrate in the first region to cover the step-like top surface of the isolation structure;
   a first doped region of a first conductive type, located in the substrate in the first region, and adjacent to one side of the gate structure; and a second doped region of the first conductive type, located in the substrate in the third region, and exposed by the second side of the isolation structure, wherein a level of the step-like top surface of the isolation structure gradually decreases from the second side of the isolation structure toward the first side of the isolation structure.

10. The semiconductor device as claimed in claim 9, wherein the top surface of the substrate between the first doped region and the second doped region is substantially coplanar.

* * * * *